(12) United States Patent
Yasumi et al.

(10) Patent No.: US 6,570,231 B1
(45) Date of Patent: May 27, 2003

(54) SEMICONDUCTOR DEVICE WITH VARYING WIDTH ELECTRODE

(75) Inventors: Masahiro Yasumi, Osaka (JP); Ichirou Matsuo, Kyoto (JP); Toshiki Yabu, Toyama (JP); Mizuki Segawa, Osaka (JP); Kunitoshi Aono, Kyoto (JP); Akihiko Ohtani, Osaka (JP); Takayuki Minemaru, Osaka (JP); Tadashi Fukumoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/652,989

(22) Filed: Aug. 31, 2000

(30) Foreign Application Priority Data

Sep. 2, 1999 (JP) .............................. 11-248149

(51) Int. Cl.$^7$ ............................... H01L 29/76
(52) U.S. Cl. ................. 257/384; 257/344; 257/353; 257/458
(58) Field of Search ................ 251/384, 380, 251/344, 408, 353, 458, 347, 352

(56) References Cited

U.S. PATENT DOCUMENTS

| | | | |
|---|---|---|---|
| 5,146,291 A | * | 9/1992 | Watabe et al. .............. 257/344 |
| 5,606,191 A | * | 2/1997 | Wang ......................... 257/336 |
| 6,010,954 A | * | 1/2000 | Ho et al. ..................... 257/344 |
| 6,013,930 A | * | 1/2000 | Yamazaki et al. .......... 257/344 |
| 6,124,622 A | * | 9/2000 | Tsutsumi .................... 257/288 |
| 2002/0102823 A1 | * | 8/2002 | Yamaguchi et al. ........ 438/487 |

FOREIGN PATENT DOCUMENTS

JP 04133348 A * 5/1992 ......... H01L/27/118

* cited by examiner

*Primary Examiner*—Wael Fahmy
*Assistant Examiner*—Nathan W. Ha
(74) *Attorney, Agent, or Firm*—Merchant & Gould P.C.

(57) ABSTRACT

An n-channel active region, a p-channel active region and an isolation insulating film are formed, and a silicon film is deposited via a gate insulating film. After introducing n-type impurities into the n-channel region and p-type impurities into the p-channel region, a silicon gate electrode is formed in such a manner that its width is enlarged only in the boundary portion between the n-channel region and the p-channel region. After forming a side wall insulating film, an n-channel diffusion layer and a p-channel diffusion layer, a metal silicide layer is formed in a self-aligned manner on the surfaces of the silicon gate electrode, the n-channel diffusion layer and the p-channel diffusion layer.

5 Claims, 12 Drawing Sheets

SEMICONDUCTOR DEVICE WITH VARYING WIDTH ELECTRODE

BACKGROUND OF THE INVENTION

1. Field of the Invention

The present invention relates to a method of producing a semiconductor device with a dual gate structure, including a metal suicide layer formed on the surfaces of a silicon gate electrode and a source/drain diffusion layer, and to a semiconductor device produced by the above-mentioned method. More particularly, it relates to a method of forming a gate electrode of a MOS transistor with a silicon gate electrode having a minimum width of about 0.35 μm or less.

2. Description of the Related Art

In recent years, for the purpose of enhancing the performance of semiconductor integrated circuit elements, a dual gate structure is adopted. In the dual gate structure, a silicon electrode into which n-type impurities are introduced is used for a gate electrode of an n-channel MOS transistor of a CMOS transistor, and a silicon electrode into which p-type impurities are introduced is used for a p-channel MOS transistor. In a semiconductor device with such a dual gate structure, an area that is not either n-type or p-type inevitably is present in the boundary portion of a silicon gate electrode formed from an n-channel region across to a p-channel region, and the resistance is rather high in the boundary portion. Therefore, with the silicon gate electrodes alone, it is difficult to conduct an electric current between the n-channel region and the p-channel region or to supply a common voltage.

In order to establish electrical connection between an n-type silicon gate electrode and a p-type silicon gate electrode, a metal silicide layer is formed on the surfaces of the silicon gate electrodes, and thus the electrical connection between the n-type silicon gate electrode and the p-type silicon gate electrode is established via the metal silicide layer.

The following is a description of a method of producing a CMOS semiconductor device with a conventional dual gate structure, including a metal silicide layer formed on the surfaces of a silicon gate electrode and a source/drain diffusion layer with reference to the drawings FIGS. 8A and 8B to 12A and 12B.

Figure 8A:
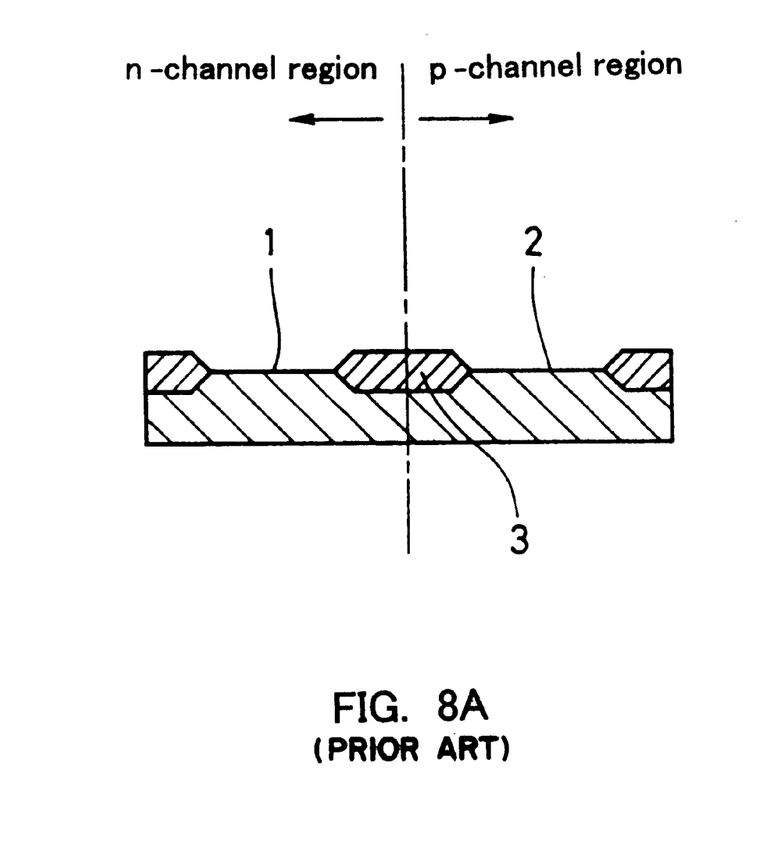
FIGS. 8A and 8B show a cross-sectional view and a plan view illustrating a process in a method of producing a conventional semiconductor device, respectively.
Figure 8B:
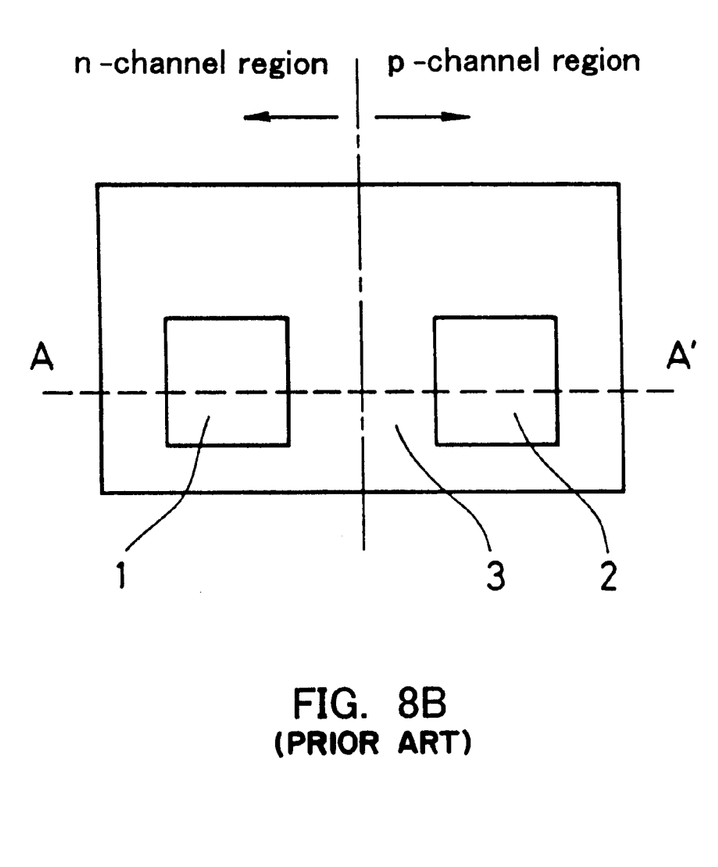
Figure 9A:
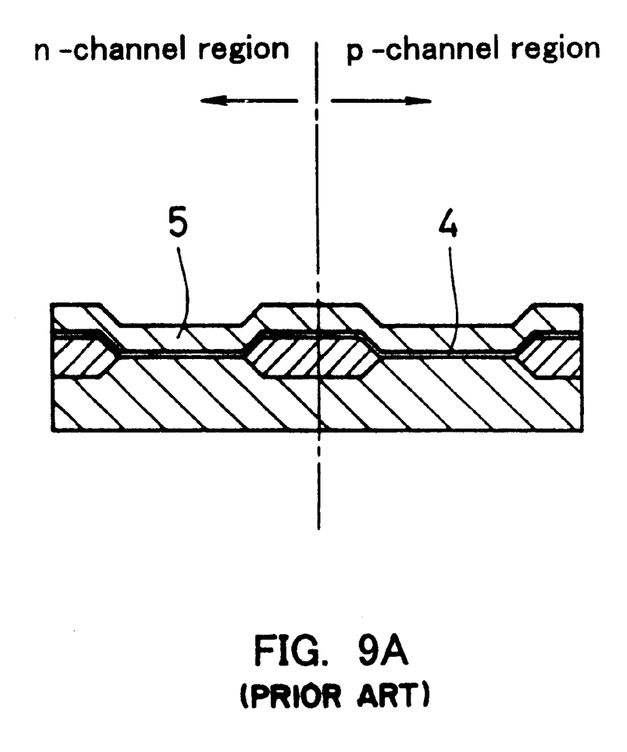
FIGS. 9A and 9B show a cross-sectional view and a plan view illustrating a process in a method of producing a conventional semiconductor device, respectively.
Figure 9B:
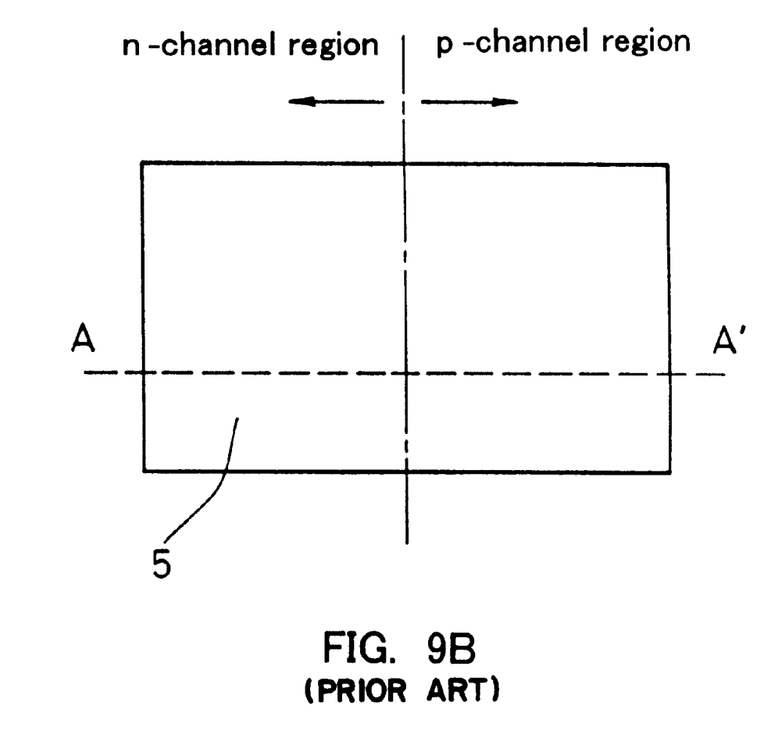

In FIGS. 8A and 8B, numeral 1 indicates an active region for an n-channel MOS transistor, on whose surface the n-channel MOS transistor is formed. Similarly, numeral 2 indicates an active region for a p-channel MOS transistor, on whose surface the p-channel MOS transistor is formed. Numeral 3 indicates an isolation insulating film for electrically isolating the transistors. In FIG. 9A, numeral 4 indicates a gate insulating film, and in FIGS. 9A and 9B, a silicon film 5 is deposited on the gate insulating film 4.

Figure 10A:
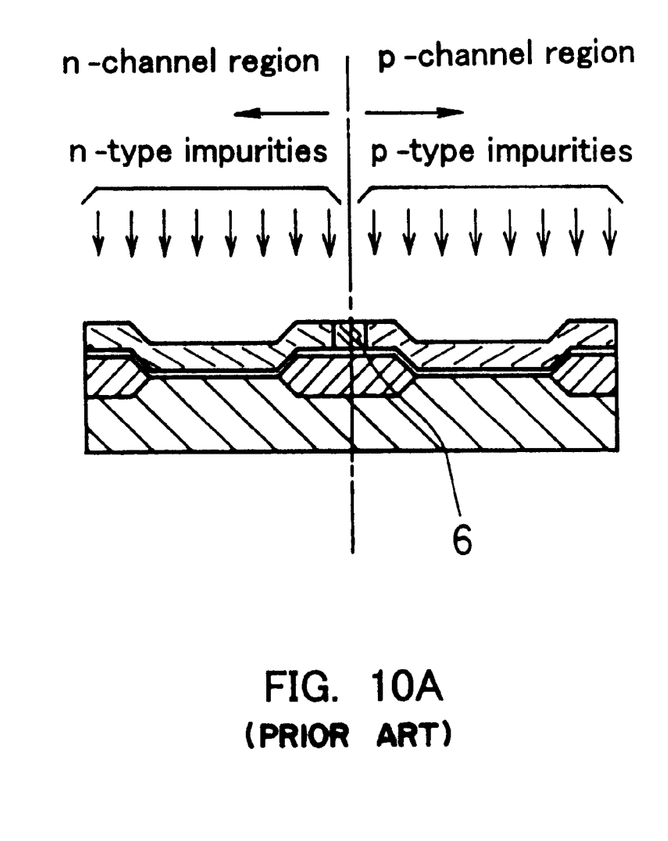
FIGS. 10A and 10B show a cross-sectional view and a plan view illustrating a process in a method of producing a conventional semiconductor device, respectively.
Figure 10B:
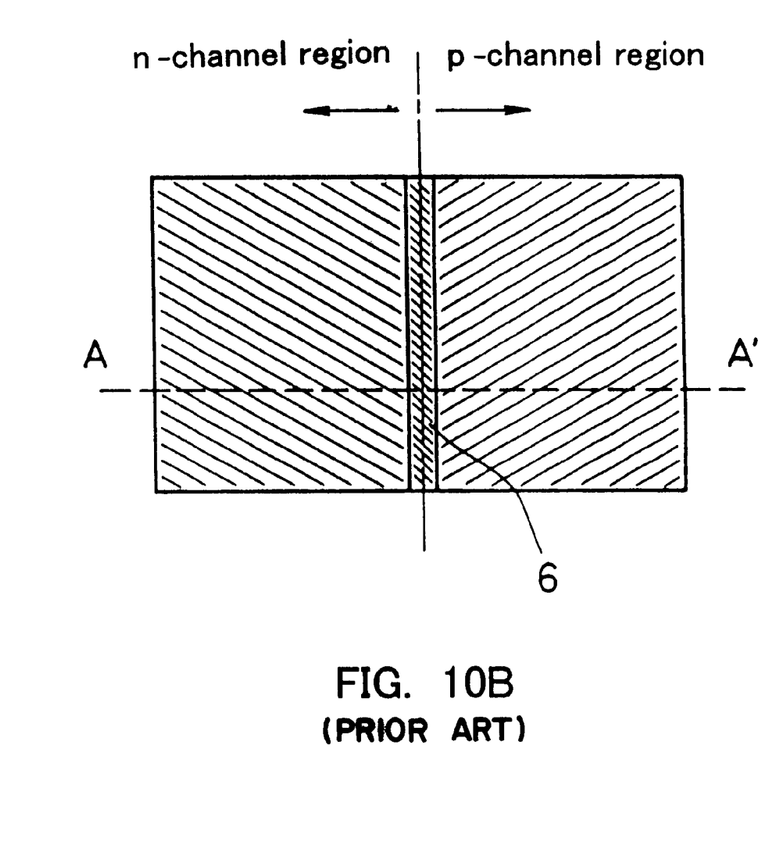

N-type and p-type impurities are implanted into the silicon film 5 by ion implantation on the n-channel region side and the p-channel region side, respectively. As shown in FIGS. 10A and 10B, an area 6 containing almost no carriers contributing to electrical conductivity inevitably is present at the boundary between the n-channel active region and the p-channel active region.

When a gap between the region where an n-channel MOS transistor is to be formed (hereinafter referred to as "n-channel region") and the region where a p-channel MOS transistor is to be formed (hereinafter referred to as "p-channel region") is large, neither n-type nor p-type impurities are implanted into the area 6 because of a mask used for ion implantation. When the n-channel region and the p-channel region are in contact with each other, or the two regions overlap, the concentration of n-type impurities and that of p-type impurities, which contribute to electrical conductivity, are equal in the area. Thus, the area 6 inevitably is present, whether or not there is a gap between the n-channel region and the p-channel region. FIGS. 10A and 10B show an example without a gap between the two regions.

Figure 11A:
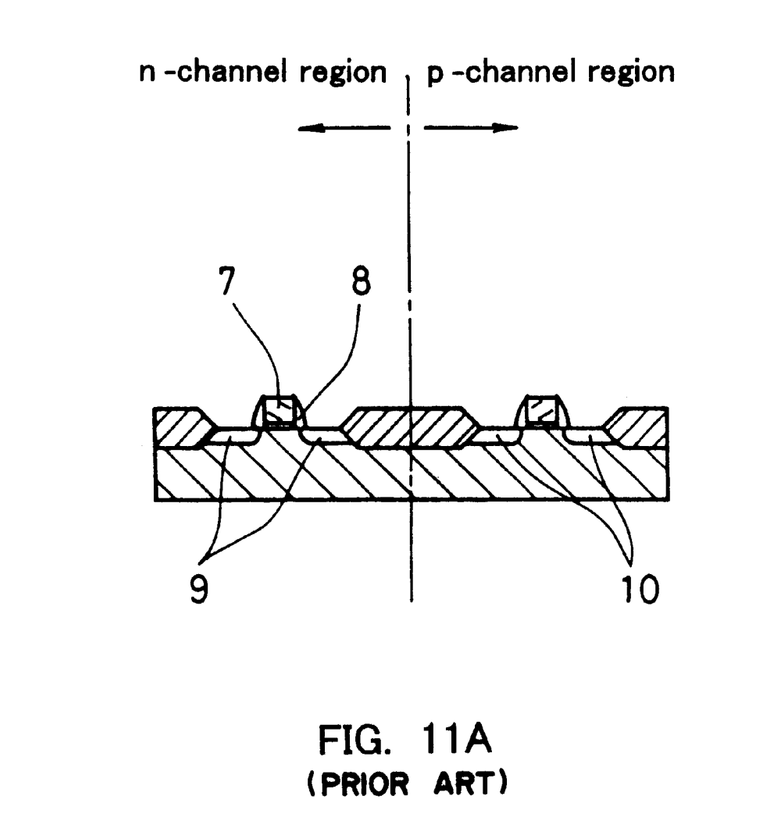
FIGS. 11A and 11B show a cross-sectional view and a plan view illustrating a process in a method of producing a conventional semiconductor device, respectively.
Figure 11B:
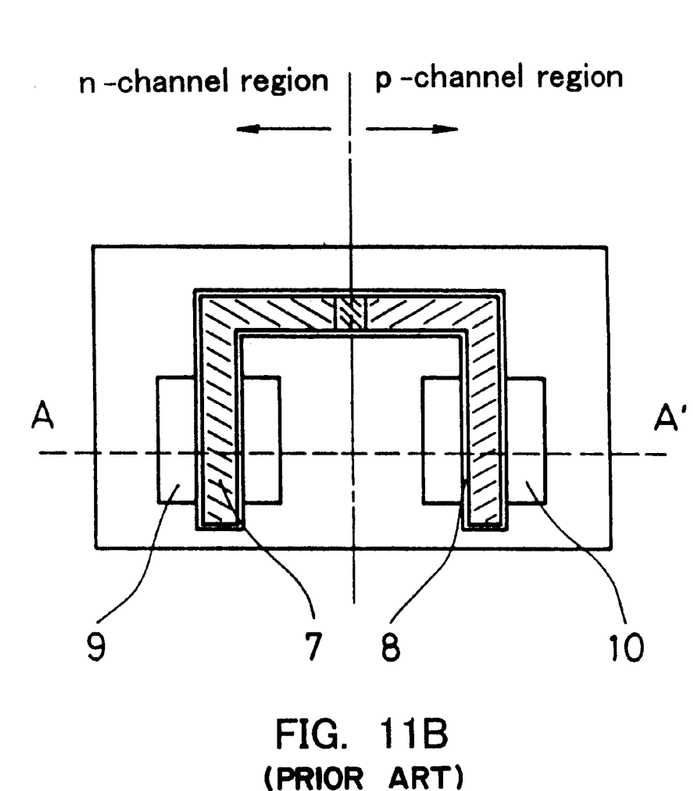
Figure 12A:
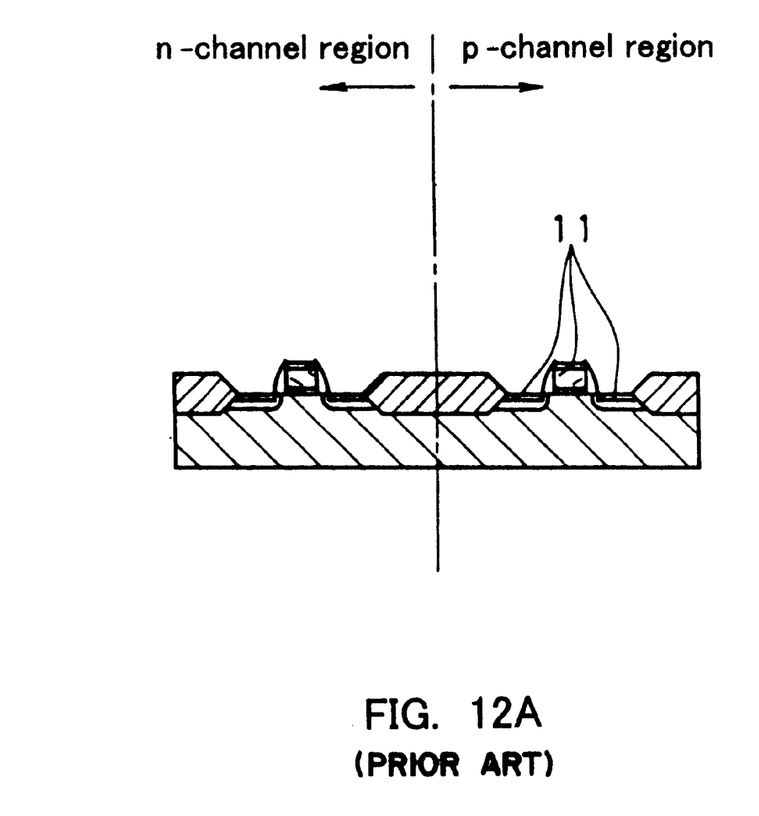
FIGS. 12A and 12B show a cross-sectional view and a plan view illustrating a process in a method of producing a conventional semiconductor device.
Figure 12B:
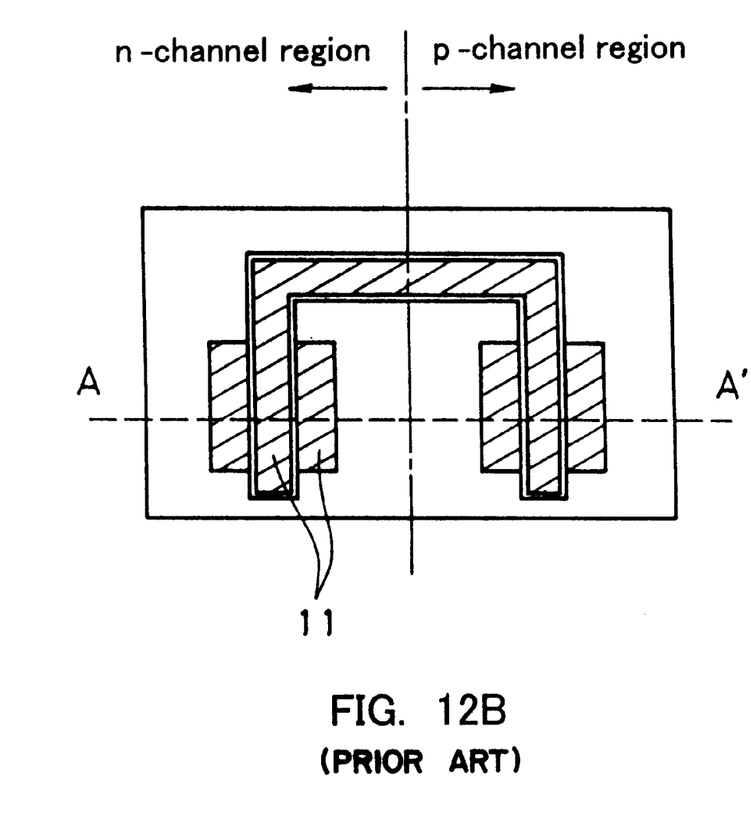

The silicon film 5 into which the above impurities are implanted is formed into a silicon gate electrode 7 by photolithography and etching. Thereafter, as shown in FIGS. 11A and 11B, a side wall insulating film 8 is formed on the side wall of the silicon gate electrode 7 in a self-aligned manner, an n-channel diffusion layer 9 is formed in the n-channel active region, and a p-channel diffusion layer 10 is formed in the p-channel active region. Then, a metal silicide layer 11 is formed on the surfaces of the silicon gate electrode and the active regions in a self-aligned manner, as shown in FIGS. 12A and 12B.

However, when the minimum width of the silicon gate electrode is about 0.35 μm or less, the following phenomena are likely to occur: Interfacial stress causes the metal silicide layer 11 to peel off partially from the surface of the silicon gate electrode 7, and the metal silicide layer 11 thermally agglomerates locally on the silicon gate electrode 7, so that some areas on the silicon gate electrode 7 are free from metal silicide. This makes it possible that the metal silicide layer is discontinued locally on some silicon gate electrodes. It is highly possible that such thermal agglomeration of the metal silicide occurs during the silicidation process by a heat treatment after depositing a metal film on the silicon gate electrode 7, a heat treatment of the metal silicide layer for reducing the resistance in a short time, or a heat-treating process of an interlayer insulating film after forming the metal silicide.

Consequently, on the silicon gate electrode that connects the n-channel region and the p-channel region, when the discontinuity of the metal suicide layer is present in the high-resistance area at the boundary between the n-channel region and the p-channel region, the electrical connection between the two regions is lost, so that it is impossible to conduct an electric current in the boundary portion. This results in circuit failure, which seriously affects the operation of the circuit.

SUMMARY OF THE INVENTION

Therefore, with the foregoing in mind, it is an object of the present invention to provide a semiconductor device where a metal silicide layer is not discontinued and no circuit failure occurs, even when the minimum width of a silicon gate electrode is about 0.35 μm or less and a method of producing the same.

A semiconductor device of the present invention comprises at least one continuous electrode including a lower layer and an upper layer, formed on a semiconductor substrate. The lower layer includes a first portion of a p-type conductive layer, a second portion of an n-type conductive layer, and a high-resistance portion at the boundary between the first portion and the second portion. The upper layer is made of a metal silicide formed on the first portion, the second portion, and the high-resistance portion. The width of the electrode is larger in a region including the entire high-resistance portion than in a region not including the high-resistance portion.

According to this embodiment, even in a minute MOS transistor circuit with a silicon gate electrode having a minimum width of 0.35 μm or less, discontinuity in the metal silicide layer formed on the surface of the silicon gate electrode can be suppressed without significantly enlarging a circuit area by increasing the width of the silicon gate electrode only in the vicinity of the boundary between the n-channel region and the p-channel region. Thus, circuit failure caused by discontinuity in the metal suicide layer can be prevented.

Furthermore, in the semiconductor device of the present invention, it is preferable that the p-type conductive layer constitutes a gate electrode of a p-channel MOS transistor and the n-type conductive layer constitutes a gate electrode of an n-channel MOS transistor. This is because the same effects can be expected for CMOS semiconductor integrated circuit devices.

Furthermore, in the semiconductor device of the present invention, it is preferable that the metal silicide is titanium silicide, cobalt silicide or nickel silicide. This is because a heat treatment causes agglomeration in separate regions, that is, a silicide portion and a silicon portion, on the gate wiring, and thus the present invention is effective when the above silicides are used.

A method of producing the semiconductor device of the present invention comprises forming a semiconductor film on a semiconductor substrate, forming a p-type conductive layer by introducing p-type impurities into a first predetermined part in the semiconductor film, forming an n-type conductive layer by introducing n-type impurities into a second predetermined part in the semiconductor film, selectively etching the semiconductor film so that the width of an area including a high-resistance portion is larger than that of the other portions, the high resistance portion being a portion into which neither p-type nor n-type impurities are introduced or forming an intrinsic-semiconductor in which p-type and n-type impurities are mutually diffused, thereby forming at least one continuous electrode including the n-type conductive layer, the p-type conductive layer and the high-resistance portion, and forming a metal silicide on the surface of the electrode.

According to this embodiment, even in a minute MOS transistor circuit with a silicon gate electrode having a minimum width of 0.35 μm or less, discontinuity in the metal silicide layer formed on the surface of the silicon gate electrode can be suppressed without significantly enlarging a circuit area by increasing the width of the silicon gate electrode only in the vicinity of the boundary between the n-channel region and the p-channel region. Thus, it is possible to produce a semiconductor device that is prevented circuit failure caused by discontinuity in the metal suicide layer.

These and other advantages of the present invention will become apparent to those skilled in the art upon reading and understanding the following detailed description with reference to the accompanying figures.

DESCRIPTION OF THE PREFERRED EMBODIMENTS

Hereinafter, a semiconductor device of the present invention and a method of producing the same will be described by way of an embodiment with reference to the accompanying drawings. FIGS. 1A and 1B to 5A and 5B show a method of producing a CMOS semiconductor integrated circuit device of an embodiment of the present invention. In particular, they are cross-sectional views and plan views of a MOS transistor in the vicinity of the boundary between an n-channel region and a p-channel region. The cross-sectional views show a cross section taken along line A–A' of the plan views.

Figure 1A:
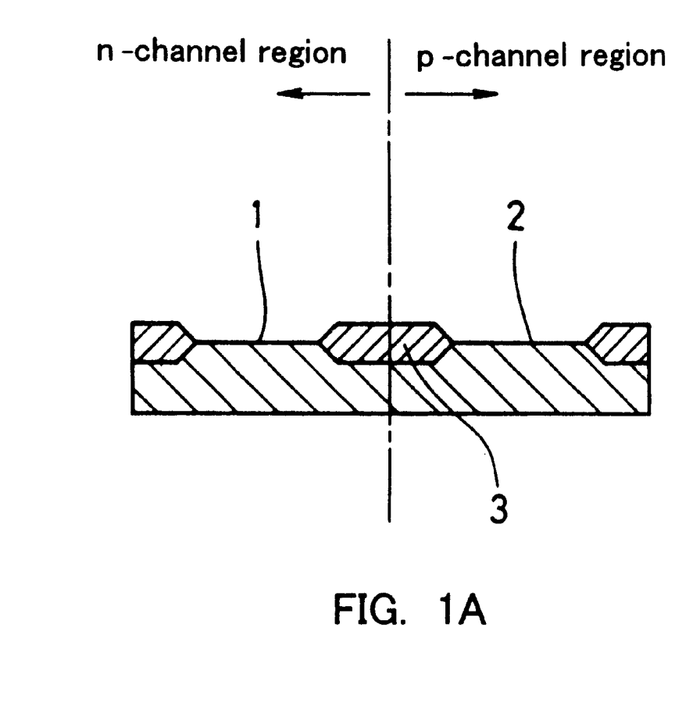
FIGS. 1A and 1B show a cross-sectional view and a plan view illustrating a process in a method of producing a semiconductor device of an embodiment of the present invention, respectively.
Figure 1B:
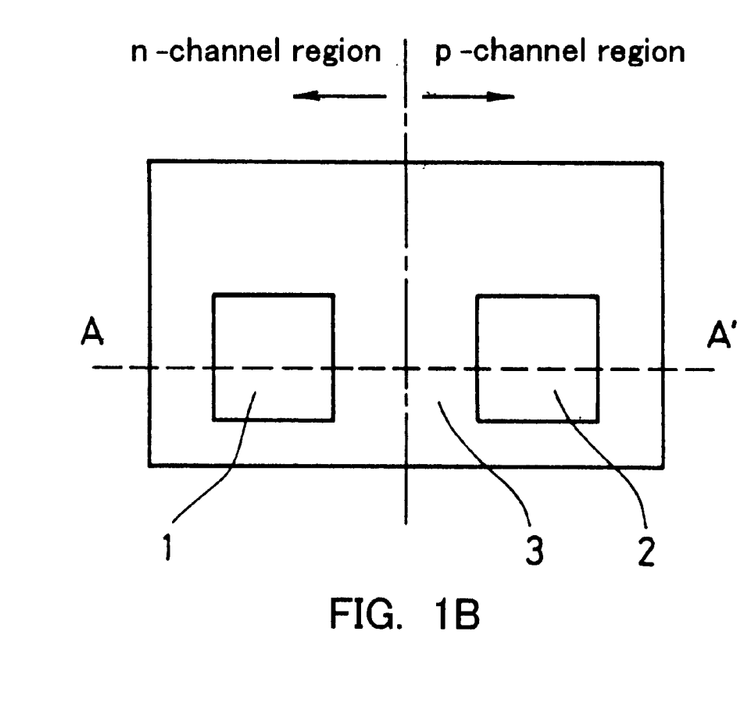
Figure 2A:
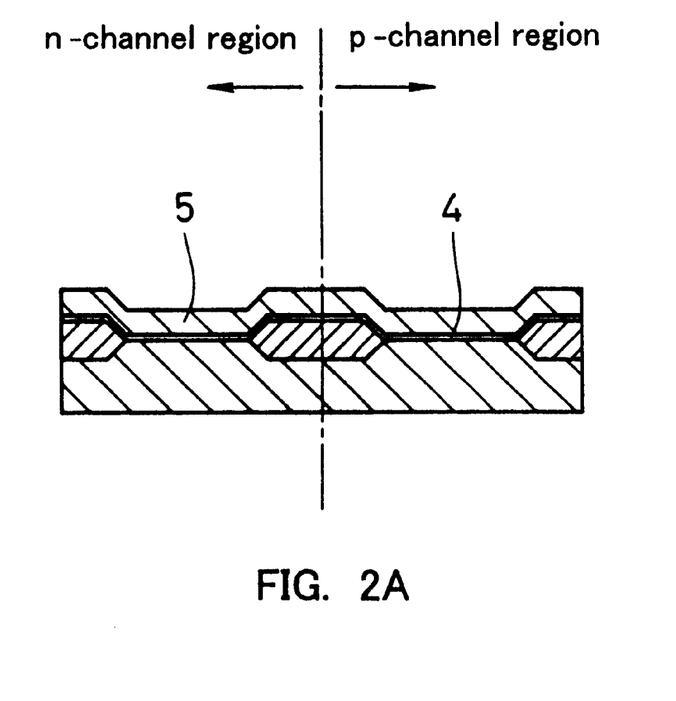
FIGS. 2A and 2B show a cross-sectional view and a plan view illustrating a process in a method of producing a semiconductor device of an embodiment of the present invention, respectively.
Figure 2B:
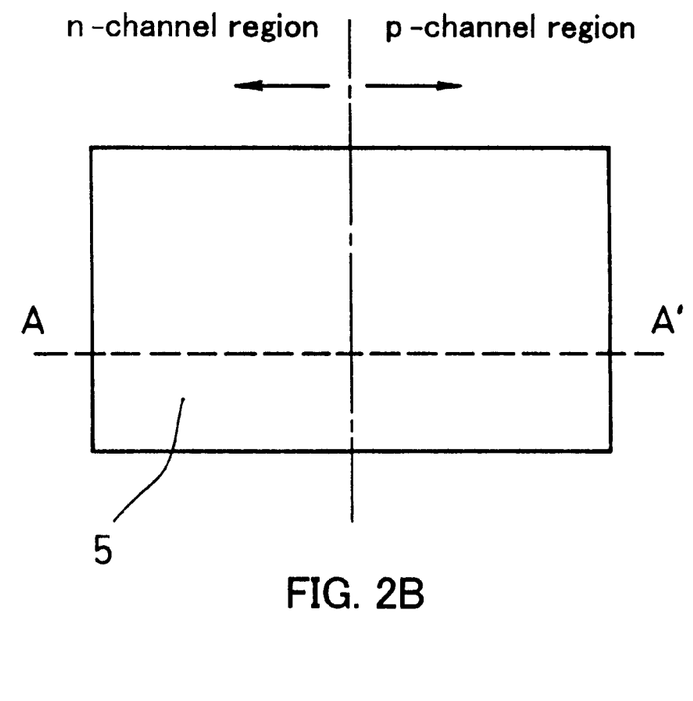

FIGS. 1A and 1B show an active region 1 of an n-channel MOS transistor, an active region 2 of a p-channel MOS transistor, and an isolation insulating film 3 that are formed on a surface of a semiconductor substrate. FIGS. 2A and 2B show a state immediately after depositing a silicon film 5 including almost no impurities via a gate insulating film 4.

Figure 3A:
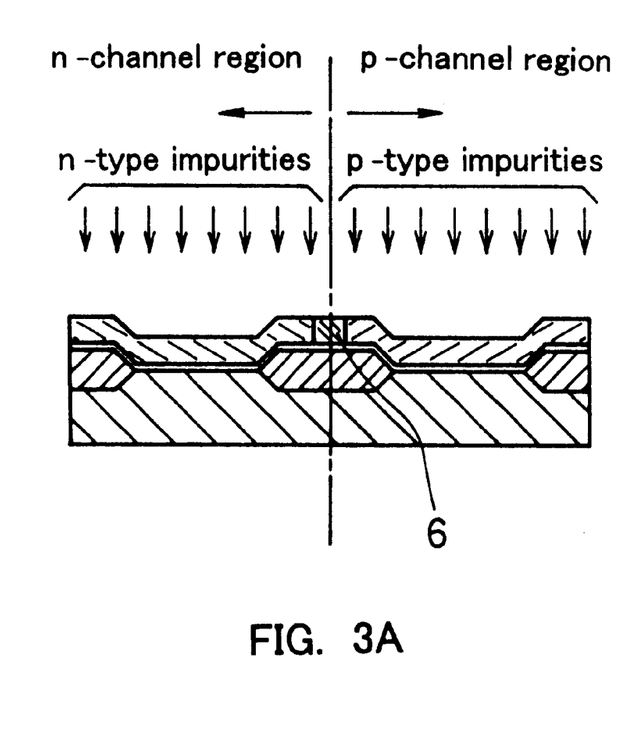
FIGS. 3A and 3B show a cross-sectional view and a plan view illustrating a process in a method of producing a semiconductor device of an embodiment of the present invention, respectively.
Figure 3B:
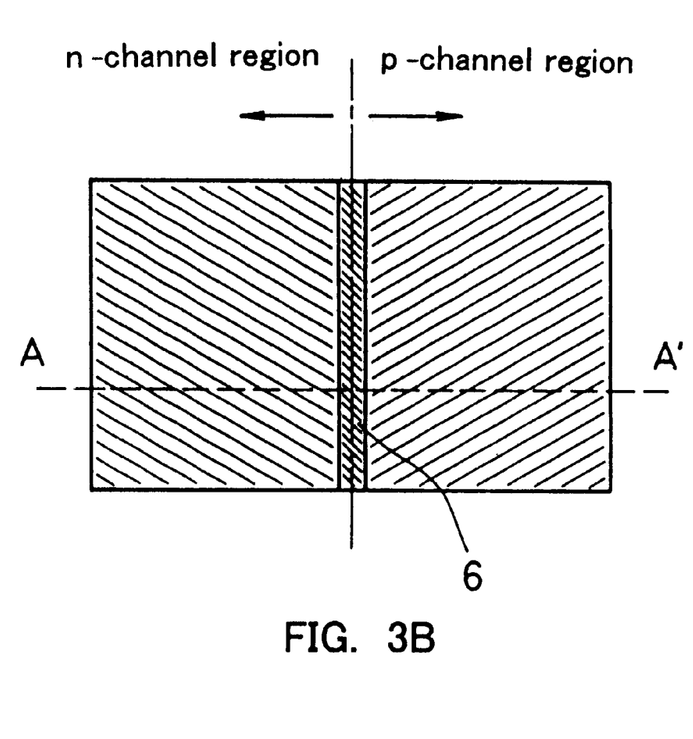

Referring to FIGS. 3A and 3B, a resist is formed over the p-channel region of the deposited silicon film 5 by photolithography, and n-type impurities (e.g. P—phosphorus) are implanted into the n-channel region by ion implantation using the resist as a mask. Similarly, a resist is formed over the n-channel region, and p-type impurities (e.g. B—boron) are implanted into the p-channel region by ion implantation using the resist as a mask. The implanted impurities are activated by a heat treatment after this process, which allows the silicon film 5 to have n-type or p-type electrical conductivity. However, a high-resistance area 6 having neither type of the conductivity is formed at the boundary between the n-channel region and the p-channel region.

Figure 4A:
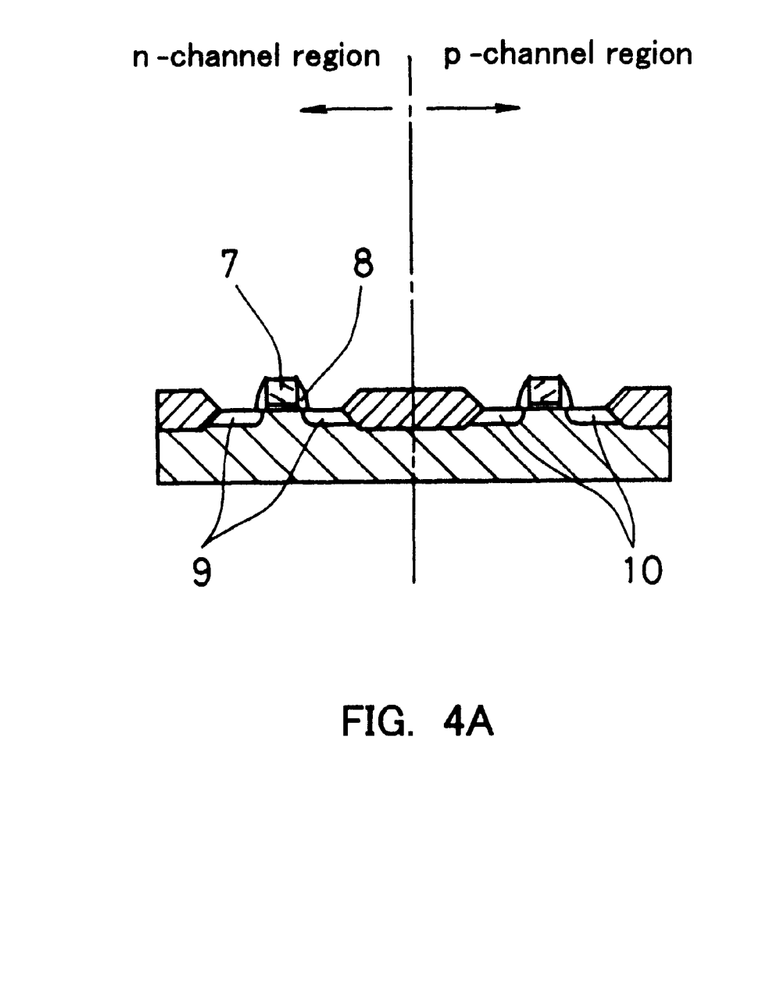
FIGS. 4A and 4B show a cross-sectional view and a plan view illustrating a process in a method of producing a semiconductor device of an embodiment of the present invention, respectively.
Figure 4B:
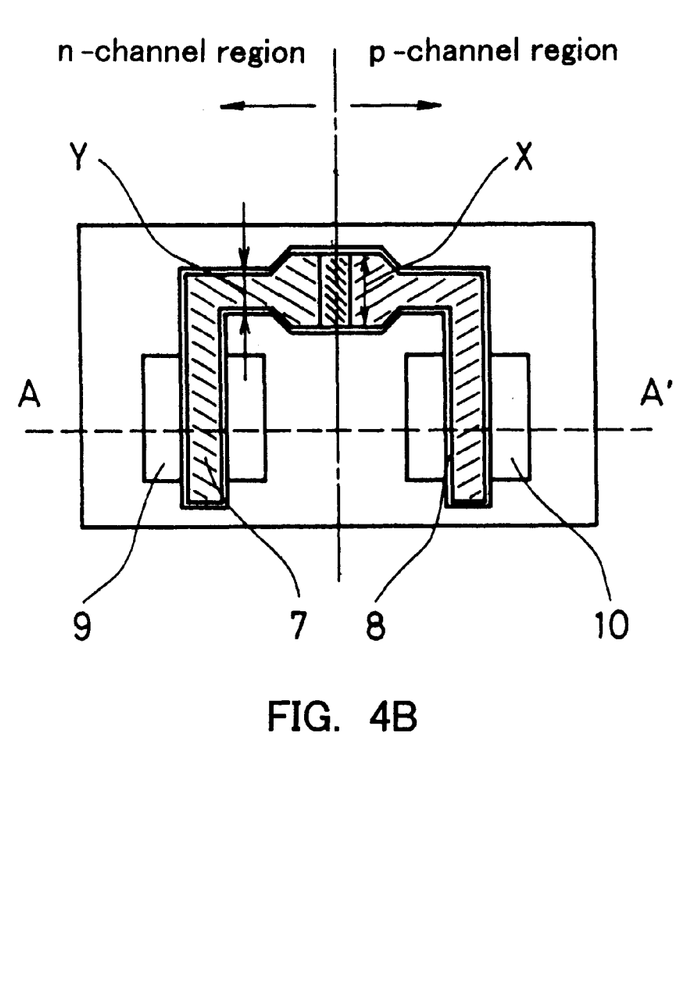

Furthermore, referring to FIGS. 4A and 4B, the silicon film 5 into which impurities are implanted is formed into a silicon gate electrode 7 by photolithography and etching. The width X of the silicon gate electrode in the boundary portion between the n-channel region and the p-channel region is larger than the width Y of the silicon gate electrode in the other region. While the larger width X of the silicon gate electrode 7 produces a better effect of suppressing discontinuity in the metal silicide layer on the surface of the silicon gate electrode, this increases the circuit area. It is preferable, therefore, that the width X is up to about 3 times larger than the width Y of the silicon gate electrode 7 in the other region. The boundary area in which the width of the silicon gate electrode is large is required to include at least the entire high-resistance area 6. With respect to the width of the wide part of the electrode, it is possible to prevent discontinuity by increasing the width of the wide part of the electrode by 10% or more of the width of the other parts of the electrode. A maximum width of the electrode is not particularly limited. However, it is preferable that an increase in the width of the electrode is limited to 50% or less, in a case where an electrode is arranged adjacent to the electrode.

Figure 5A:
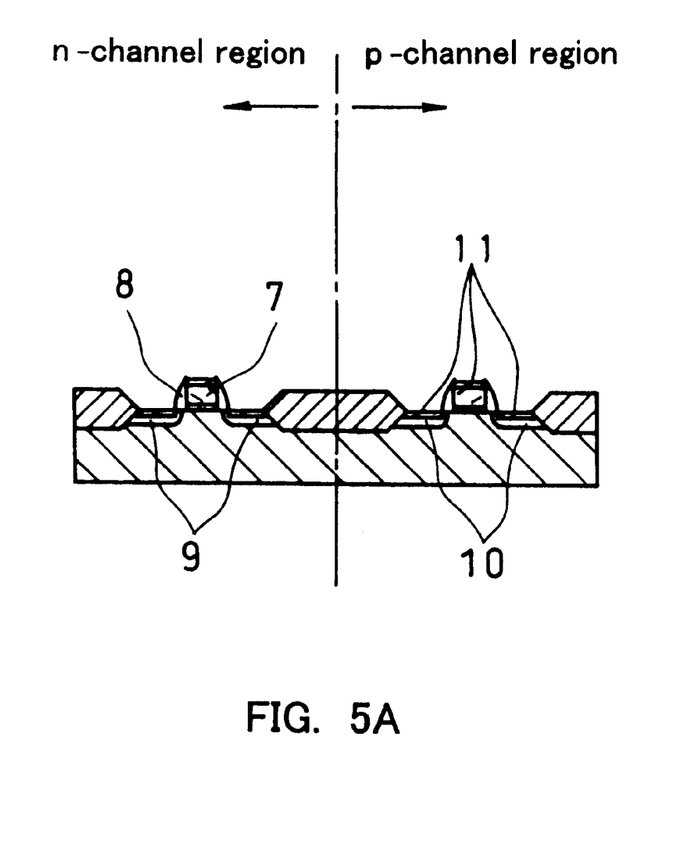
FIGS. 5A and 5B show a cross-sectional view and a plan view illustrating a process in a method of producing a semiconductor device of an embodiment of the present invention, respectively.
Figure 5B:
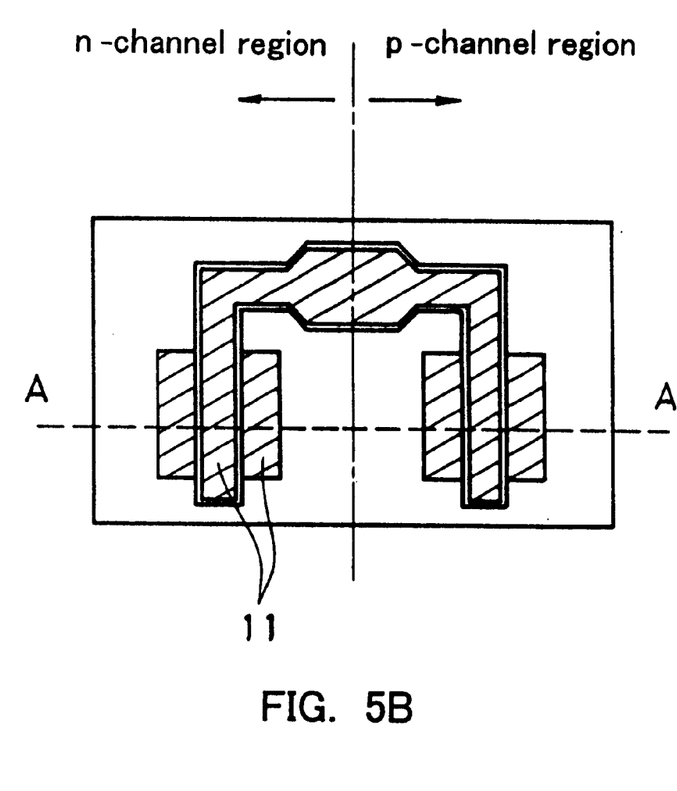

Referring to FIG. 5A, a side wall insulating film 8, an n-channel diffusion layer 9 and a p-channel diffusion layer 10 have been formed in a self-aligned manner with respect to the silicon gate electrode 7. In FIGS. 5A and 5B, a metal silicide layer 11 is formed in a self-aligned manner on the surfaces of the silicon gate electrode 7, the n-channel diffusion layer 9 and the p-channel diffusion layer 10. Thereafter, according to the usual manufacturing processes, an insulating film is formed over the entire surface including the silicon gate electrode 7 and heat-treated at a temperature of about 600° C. to 900° C., and then wiring is formed of aluminum as the main component.

The process of producing a semiconductor device of the embodiment of the present invention is characterized in that the width of the silicon gate electrode is enlarged in the boundary portion between the n-channel region and the p-channel region. This configuration can prevent discontinuity in the metal silicide layer caused by agglomeration of the metal silicide layer during a heat treatment or by stress at an interface between the silicon gate and the metal silicide, in the boundary portion between the p-type and n-type conductive portions of the silicon gate electrode. Consequently, stable electrical connection between the n-type silicon gate electrode and the p-type silicon gate electrode can be established.

Figure 6:
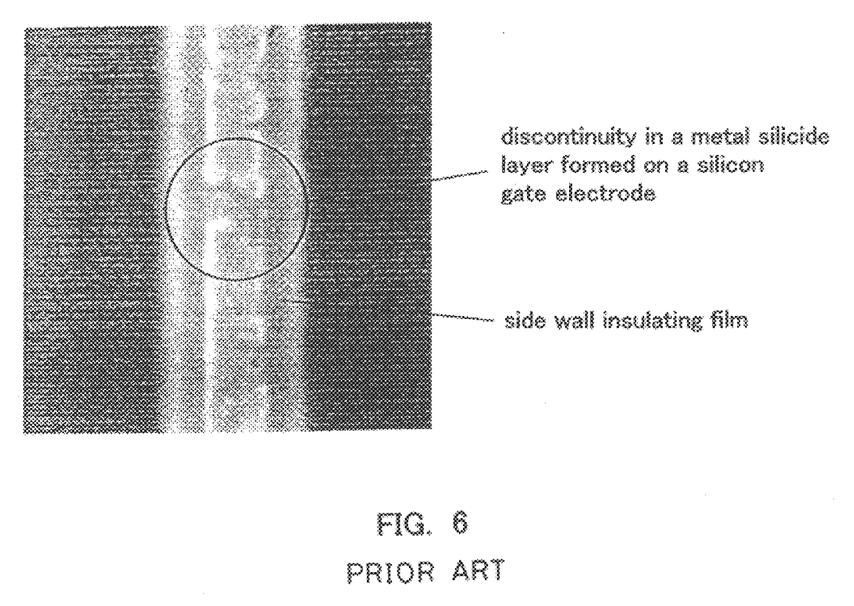
FIG. 6 is a micrograph of a discontinued metal silicide layer on a conventional silicon gate electrode.

FIG. 6 shows a scanning electron micrograph of the shape of a metal silicide layer formed when the silicon gate electrode has a small width, for example 0.20 µm. It is clear that there is discontinuity in the metal silicide layer formed on the surface of the silicon gate electrode. The electrical properties become poor when such discontinuity is present on the silicon gate electrode at the boundary between the n-channel region and the p-channel region.

Figure 7:
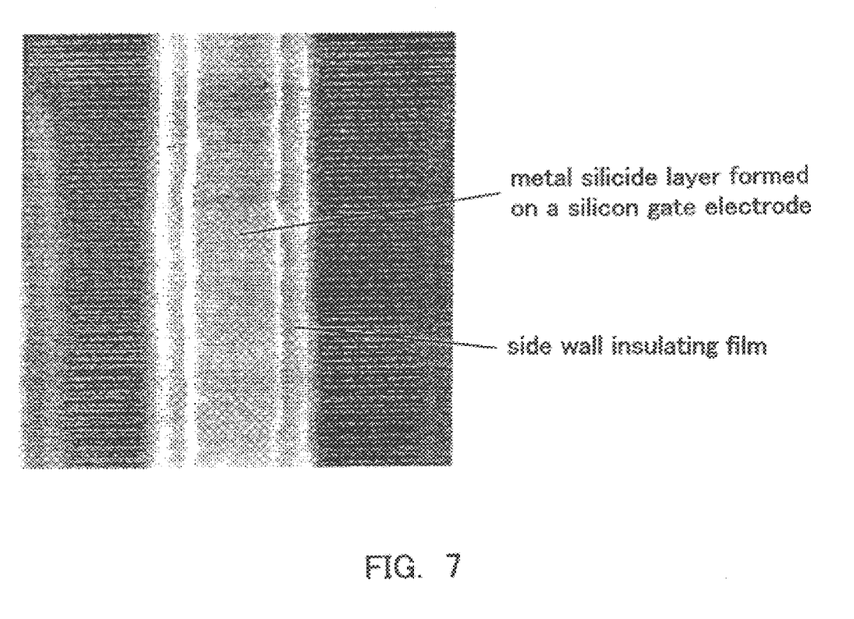
FIG. 7 is a micrograph of a metal silicide layer on a silicon gate electrode of the present invention.

FIG. 7, on the other hand, shows a scanning electron micrograph of the shape of a metal silicide layer formed when the silicon gate electrode has a larger width as in the present invention, for example 0.26 µm. It is clear from FIG. 7 that the discontinuity in the metal suicide layer as shown in FIG. 6 is not observed, and a uniform metal silicide layer is formed on the entire surface of the silicon gate electrode. This can confirm that discontinuity in the metal silicide layer can be prevented by increasing the width of the silicon gate electrode in the vicinity of the boundary between the n-channel region and the p-channel region.

In this case, titanium suicide, cobalt silicide and nickel silicide can be used for the metal suicide. For these silicides, a heat treatment causes agglomeration in separate portions, that is, a silicide portion and a silicon portion, on the gate wiring, and thus the present invention is effective when the above silicides are used. However, the present invention is not limited to a case where these materials are used and also can be applied to a case where a metal silicide such as molybdenum silicide, tungsten silicide and the like is used, where agglomeration itself is less likely to occur within a temperature range and time of heat treatment used for a semiconductor integrated circuit.

Furthermore, the above-mentioned discontinuity in the silicide on the gate electrode at the boundary between the p-type and the n-type regions caused by agglomeration or stress in the metal suicide layer occurs with variations depending on silicidation or the subsequent heat treatment conditions. When a dual gate is employed and the width of the silicon gate electrode in a semiconductor integrated circuit is about 0.35 µm or less, the probability of actual occurrence of the discontinuity cannot be ignored under the specific heat treatment condition for each integrated circuit. However, adopting the present invention can prevent the discontinuity. In FIG. 7, when the silicon gate electrode in the active region that serves as a transistor and its extended portion has a width of 0.20 µm, a slight increase of the width to 0.26 µm can prevent discontinuity. This is because the heat-treating time and temperature required for producing a semiconductor integrated circuit having an electrode width of 0.20 µm are shorter or lower than those of a semiconductor integrated circuit having an electrode width of 0.35 µm.

According to the above-mentioned embodiments, even in a minute MOS transistor circuit with a silicon gate electrode having a minimum width of 0.35 µm or less, discontinuity in the metal silicide layer formed on the surface of the silicon gate electrode can be suppressed without significantly enlarging a circuit area by increasing the width of the silicon gate electrode only in the vicinity of the boundary between the n-channel region and the p-channel region. Thus, circuit failure caused by discontinuity in the metal silicide layer can be prevented.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   at least one continuous gate electrode formed on a semiconductor substrate including:
   a semiconductor film comprising a first portion of a p-type conductive layer, a second portion of an n-type conductive layer, and a high-resistance portion at a boundary between the first portion and the second portion, and
   a metal silicide formed across the first portion, the second portion and the high-resistance portion of the semiconductor film,
   wherein a width of the metal silicide is larger in a region including the entire high-resistance portion than in a region not including the high-resistance portion, so that the metal silicide is not discontinued in a region including the high-resistance portion during a heat treatment.

2. The semiconductor device according to claim 1, wherein the p-type conductive layer constitutes a gate electrode of a p-channel MOS transistor, and the n-type conductive layer constitutes a gate electrode of an n-channel MOS transistor.

3. The semiconductor device according to claim 1, wherein the metal silicide is titanium silicide, cobalt silicide or nickel silicide.

4. The semiconductor device according to claim 2, wherein the metal silicide is titanium silicide, cobalt silicide or nickel suicide.

5. The semiconductor device of claim 1, wherein said gate electrode is about 0.35 $\mu$m or less.

* * * * *